United States Patent [19]
Lee et al.

[11] Patent Number: 4,667,219
[45] Date of Patent: May 19, 1987

[54] SEMICONDUCTOR CHIP INTERFACE

[75] Inventors: James C. K. Lee, Los Altos; Gene M. Amdahl, Atherton; Richard L. Beck; Robert F. Quinn, both of Cupertino; Jerzy R. Sochor, San Jose, all of Calif.

[73] Assignee: Trilogy Computer Development Partners, Ltd., Cupertino, Calif.

[21] Appl. No.: 604,783

[22] Filed: Apr. 27, 1984

[51] Int. Cl.[4] .................... H01L 23/48; H01L 23/52; H01L 23/40; H01L 23/12
[52] U.S. Cl. ........................................ 357/68; 357/82; 357/80; 357/74
[58] Field of Search .................. 357/80, 82, 81, 75, 357/68, 80, 82, 81, 75, 68, 74

[56] References Cited

U.S. PATENT DOCUMENTS

| | | | |
|---|---|---|---|
| 3,862,790 | 1/1975 | Davies et al. | 339/ |
| 3,982,320 | 9/1976 | Buchoff et al. | 29/ |
| 4,003,621 | 1/1977 | Lamp | 339/ |
| 4,225,900 | 9/1980 | Ciccio et al. | 357/80 |
| 4,407,007 | 9/1983 | Desai et al. | 357/74 |
| 4,453,176 | 9/1984 | Chance et al. | 357/68 |
| 4,551,746 | 11/1985 | Gilbert et al. | 357/68 |

OTHER PUBLICATIONS

Markewycz, IMB Tech. Disl. Bull. 19:1270-1271 (1976).
Neuman et al. IBM Tech. Disc. Bull. 25:1801-1802 (1982).
Johnson IBM Tech. Disc. Bull 20: 3919-3920 (1978).
Johnson et al. IBM Tech. Disc. Bull. 12:1665 (1970).
Tiffany IBM Tech. Disc. Bull. 13:58 (1970).
"Microelectronic Packaging-Blodgett, Jr.-Scientific American Magazine, July, 1983, vol. 249, No. 1, pp. 86-96.
"Integrated Circuit Package and Heat Sink-Tiffany Technical Disclosure Bulletin-Tiffany-vol. 13, No. 1, Jun. 1970, p. 58.
"Electrically Conductive Array in an Elastomeric Material-Neumann et al.-IBM Technical Disclosure Bulletin-vol. 25, No. 4.
"Device Cooling" Johnson-IBM Tech. Disclosure vol. 28, No. 10, Mar. 1978, pp. 3919-3920.
"Chin Heat Sink Assembly" Johnson et al., IBM Tech. Disclosure, vol. 12, No. 10, Mar. 1970 p. 1665.
"Integrated Circuit Package and Heat Sink" Tiffany IBM Tech. Disclosure vol. 13 No. 1 6-1970 p. 58.
"Electrically Conductive Array in an Elastomeric Material"-Neuman et al.-IBM Tech. Disclosure-vol. 25, No. 4 9-1982 p. 1801-1802.
"Distribution System for multilayer Ceramic Modules'-'-Markewycz-IBM Tech. Disclosure vol. 19, No. 4, 9-1976 p. 1270.
"Module Package with Heat Sink Between Substrate and Circuit Board"-Stackhouse-IBM Technical Disclosure vol 22 No. 4 9-1979 p. 1426-1429.
"Batch Packaging Speeds System Assemblies of IC's"--Lomersom, Electronics 4-1967 p. 139-146.

Primary Examiner—Andrew J. James
Assistant Examiner—S. V. Clark
Attorney, Agent, or Firm—Townsend & Townsend

[57] ABSTRACT

A semiconductor chip module for a semiconductor chip having an exposed front face with a two dimensional array of contacts is disclosed. A connector plate is located proximate the front face of the chip. The connector plate has a plurality of apertures which correspond to and are aligned with the contacts of the semiconductor chip. A plurality of transmission elements are located proximate the connector plate opposite from the semiconductor chip. A plurality of flexible conductors extend through the respective apertures of the connector plate. The flexible conductors are electrically coupled to the contacts of the chip and to the transmission elements.

20 Claims, 15 Drawing Figures

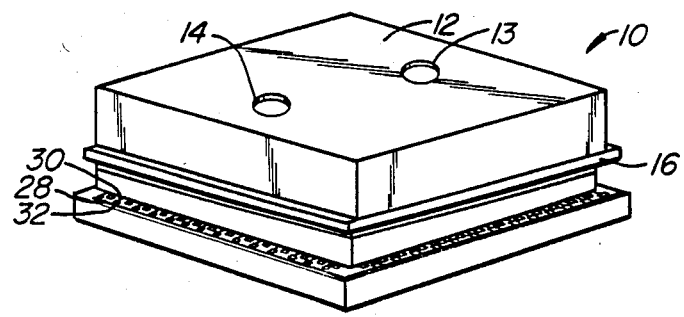
FIG._1.
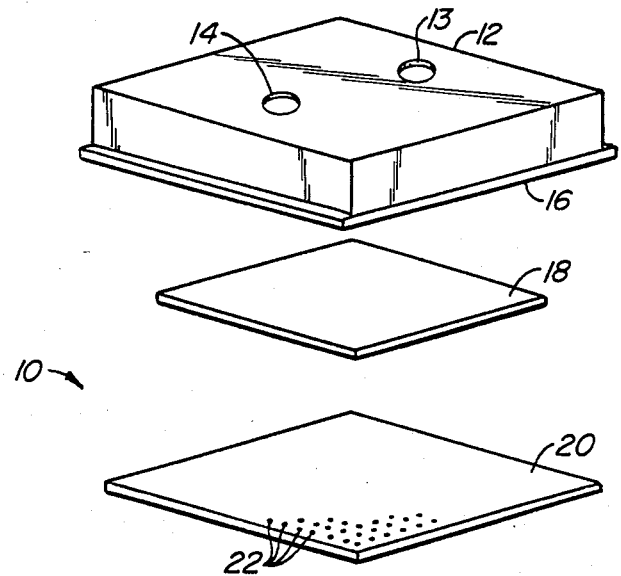
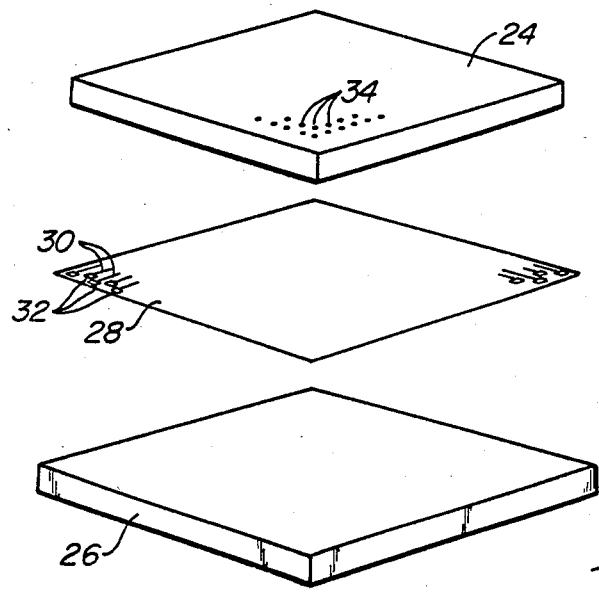
FIG._2.

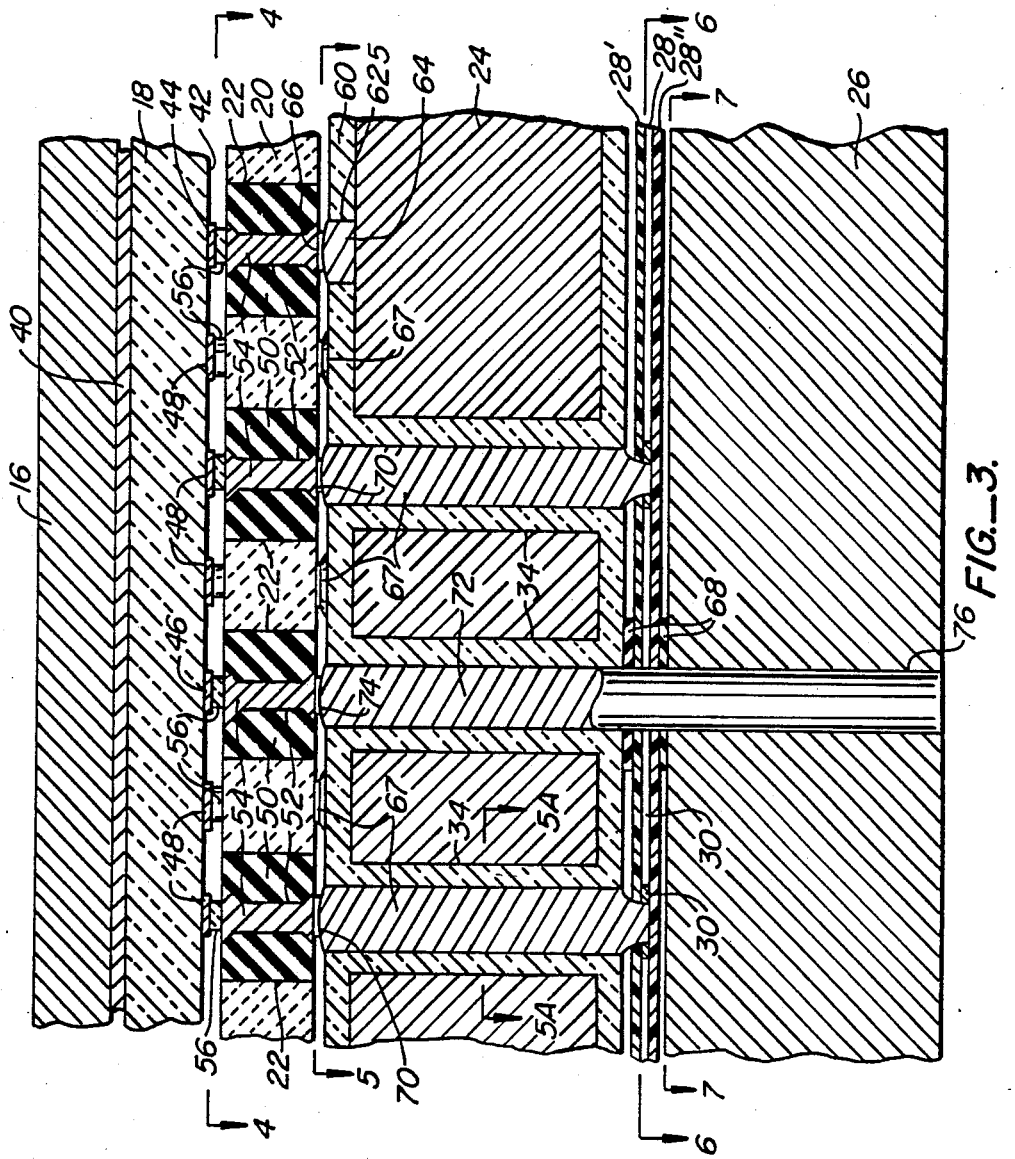
FIG._3.

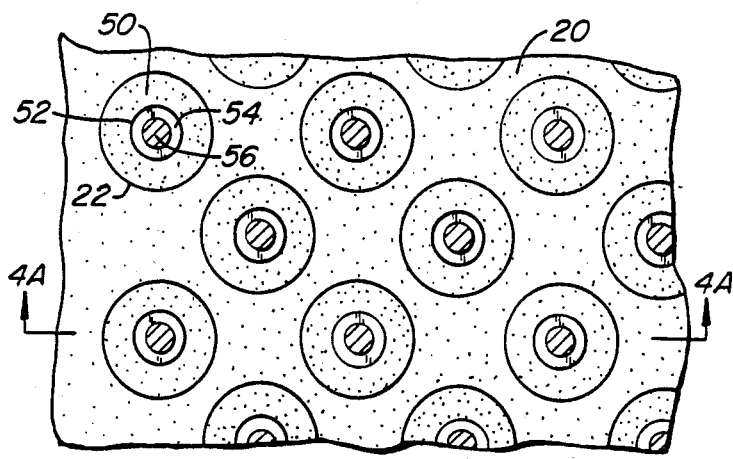
FIG._4.
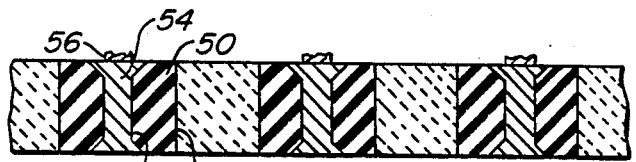
FIG._4A.
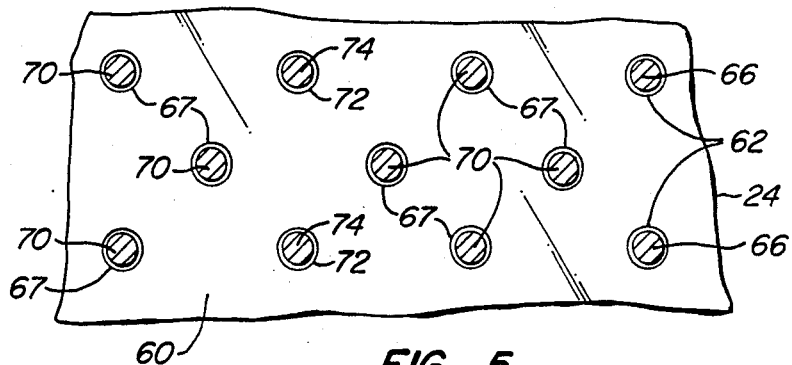
FIG._5.
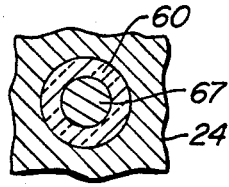
FIG._5A.

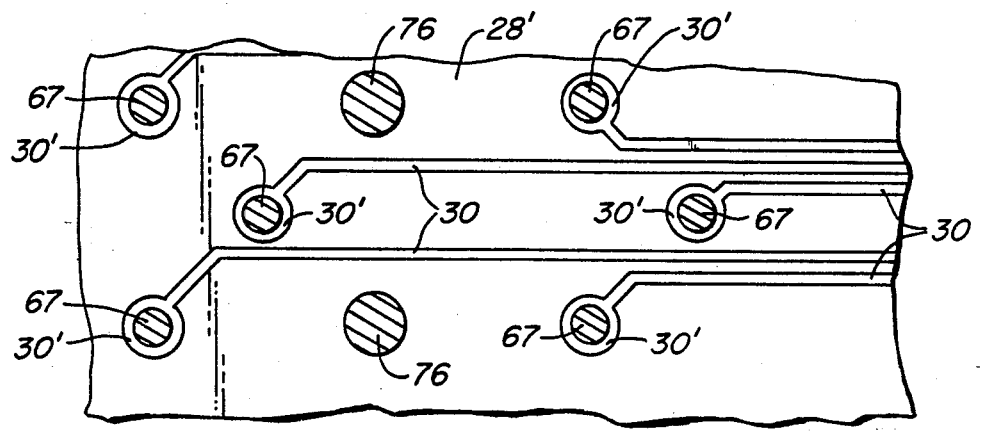
FIG._6.
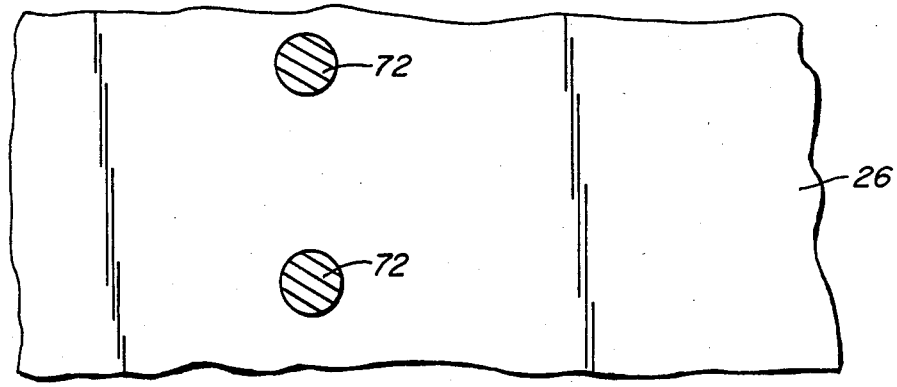
FIG._7.

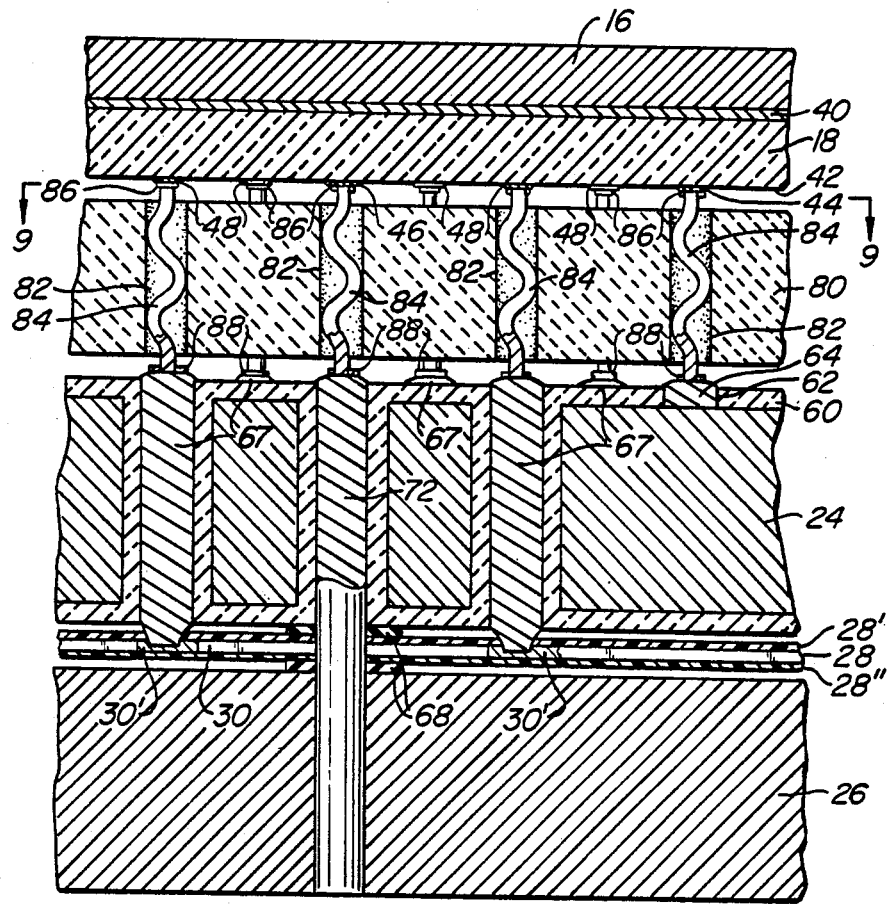
FIG._8.
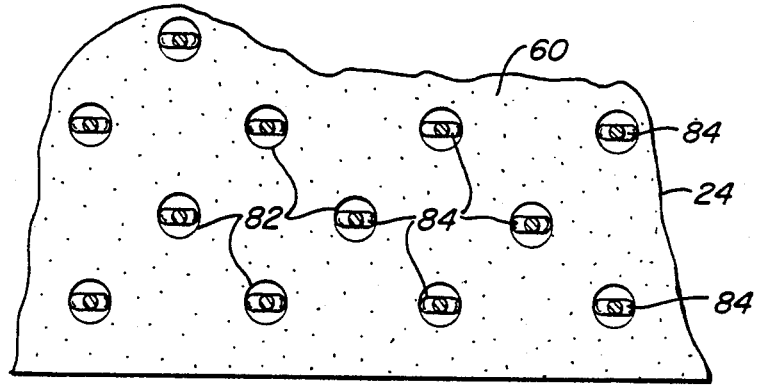
FIG._9.

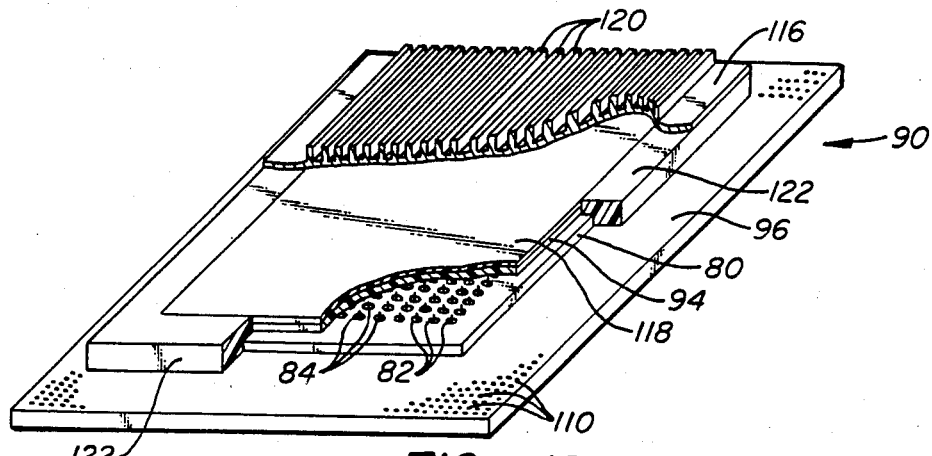
FIG._10.
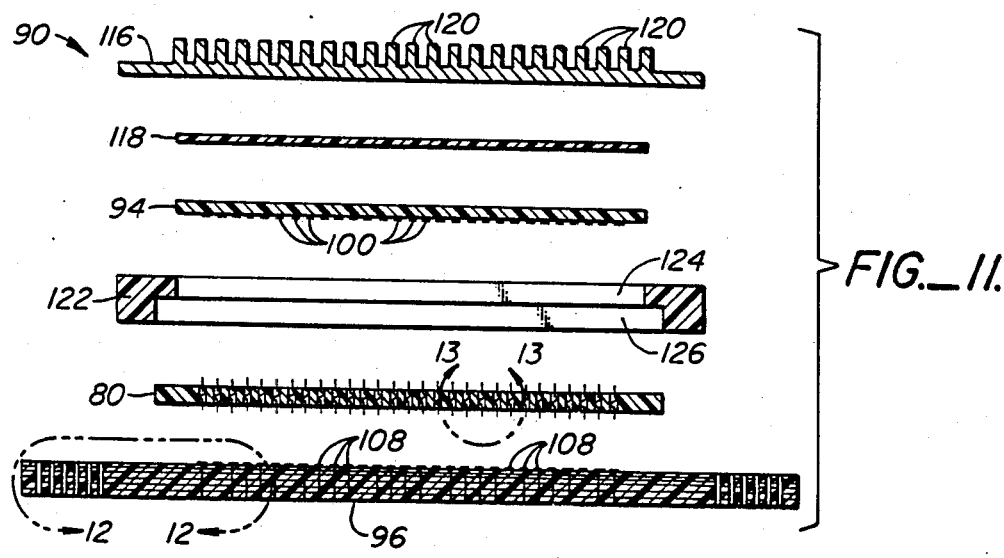
FIG._11.
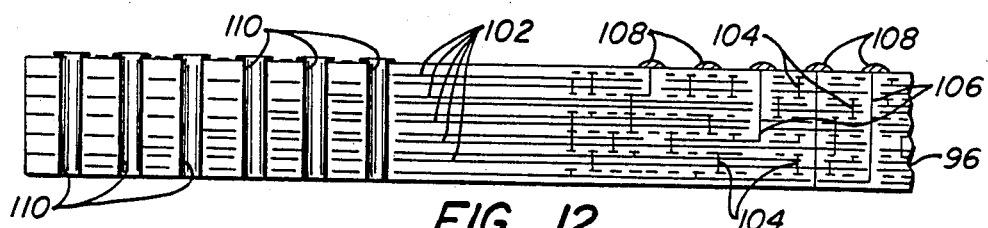
FIG._12.
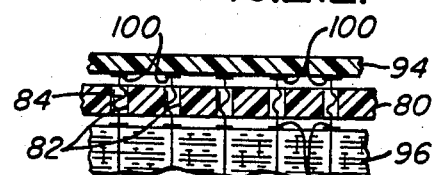
FIG._13.

SEMICONDUCTOR CHIP INTERFACE

BACKGROUND OF THE INVENTION

The present invention relates to the interface between a semiconductor chip and other elements in a computer system.

At the present time, computers other than very small computers utilize a large number of small chips to perform arithmetic and memory functions. Significant spacing is generally provided between the chips because of the necessity of heat dissipation. Each chip contains various logic and memory circuits, and the circuits on the various chips communicate with one another and with other elements in the system by means of signals. The signals are carried by conductors which interconnect the various elements in the system, and the transmission time for each particular signal is significant relative to the overall computation speed of a computer because of the spacing between the various chips and other elements. Considering the high volume of signals that must be exchanged, the aggregate transmission time for the numerous signals transmitted represents a very substantial limitation on overall system speed.

One technique for at least partially resolving the system speed limitations arising from the use of a large number of small chips is the substitution of a relatively fewer number of large chips for the numerous small chips. When large chips are employed, many of the communications between various logic and memory circuits will be made between circuits on the same chip, and because of the close proximity of the circuit elements the transmission time is virtually nil.

One of the difficulties in the utilization of large chips, however, is the fact that the various circuit elements must communicate with one another, and must have sources of power and ground as well. Typically, contacts are provided about the periphery of a chip, with the various circuit elements exchanging signals, receiving power and providing a ground through these contacts. When the dimensions of the chip are increased, the number of circuit elements which can be accommodated on a given chip rises much more rapidly than the number of contacts which can be accommodated about its periphery. Also, the necessity of providing transverse leads from the circuits to the edge of the chip adds complexity to an already complex device.

Attempts have been made to construct semiconductor chips with a two dimensional array of contacts, to solve the problem of providing transverse leads and sufficient peripheral contacts when the number of circuits is enlarged. To connect such a chip to other elements, the chip is typically located substantially flush with a printed circuit board or other flat surface with multiple connections, and the chip contacts are coupled to the connections with multiple pinpoint solder connections. Unfortunately, there is typically thermal expansion mismatch between the chip and the printed circuit board, both during assembly and in use, resulting in stresses on the connections which can break the connection, or worse, fracture the delicate semiconductor chip circuits. As chip size increases, the effect of thermal expansion mismatch becomes more pronounced, and the problem is magnified.

SUMMARY OF THE INVENTION

The present invention provides a semiconductor chip module for a semiconductor chip having an exposed front face with a two dimensional array of contacts. A connector plate is located proximate the front face of the chip. The connector plate has a plurality of apertures which correspond to and are aligned with the contacts of the semiconductor chip. A plurality of transmission elements are located proximate the connector plate opposite from the semiconductor chip. A plurality of flexible conductors extend through the respective apertures of the connector plate. The flexible conductors are electrically coupled to the contacts of the chip and to the transmission elements.

Because the conductors are flexible, and are located in apertures in the connector plate, a flexible connection is provided between each contact on the chip and each transmission element. Any thermal expansion mismatch between the semiconductor chip and the transmission elements are accommodated by the flexible conductors, so that no significant mechanical strain is placed on the chip either during the heating incurred in the assembly operation, or in actual usage. The conductors may include power, ground and signal conductors coupled to corresponding power, ground and signal contacts on the chip. When high-power chips are employed, the signal transmission elements are typically discrete, with relatively massive plates used to provide power and ground. When low-power chips are employed, the power, ground and signal transmission members are typically similar in nature.

The novel features which are characteristic of the invention, as to organization and method of operation, together with further objects and advantages thereof will be better understood from the following description considered in connection with the accompanying drawings in which preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a perspective view of a semiconductor chip module which incorporates a preferred embodiment of the chip interface of the present invention adapted for a high-power chip;

FIG. 2 is an exploded view of the module of FIG. 1;

FIG. 3 is an enlarged fragmentary sectional view of the module of FIG. 1;

FIG. 4 is a section view taken along line 4—4 of FIG. 3, and FIG. 4A is a section view taken along lines 4A—4A of FIG. 4;

FIG. 5 is a section view taken along lines 5—5 of FIG. 3, and FIG. 5A is an enlarged fragmentary section view taken along lines 5A—5A of FIG. 3;

FIG. 6 is a section view taken along lines 6—6 of FIG. 3;

FIG. 7 is a section view taken along line 7—7 of FIG. 3;

FIG. 8 is a fragmentary section view of an alternate embodiment of the interface of the invention as incorporated in a high power chip module such as that illustrated in FIG. 1;

FIG. 9 is a section view taken along lines 9—9 of FIG. 8.

FIG. 10 is a partially broken away perspective view of a low power semiconductor chip module which incorporates the embodiment of FIG. 8;

FIG. 11 is an exploded view of the module of FIG. 10;

FIG. 12 is an enlarged section view taken along lines 12—12 of FIG. 11; and

FIG. 13 is an enlarged fragmentary section view taken along lines 13—13 of FIG. 11.

DESCRIPTION OF THE PREFERRED EMBODIMENT

A semiconductor chip module 10 containing the features of the present invention is illustrated generally by way of reference to FIGS. 1 and 2. Module 10 includes a heat sink 12 with a fluid inlet 13 and fluid outlet 14 through which a cooling fluid such as water is circulated. A cold plate 16 is located at the base of heat sink 12, and has a flat underlying surface to which a semiconductor chip 18 is secured. In the embodiment of FIG. 1, chip 18 is a single, large, wafer scale bipolar chip having dimensions on the order of 60 by 60 millimeters. Bipolar chips of such dimensions operate with high power levels and require active cooling such as that provided by heat sink 12.

The exposed, front surface of semiconductor chip 18, opposite from the back surface which is secured to cooling plate 16, has a two dimensional array of power, ground and signal contacts which are illustrated hereinafter. A connector plate 20 of rigid material, typically a plastic, ceramic or other electrically insulative material, is juxtaposed to the front surface of semiconductor chip 18. Connector plate 20 has a plurality of apertures 22 juxtaposed to and corresponding with the respective power, ground and signal contacts on chip 18. Conductors extend through apertures 22, as will be illustrated in more detail hereinafter.

A power plate 24 is located at the underside of connector plate 20, and is connected to a source of power, typically −0.5 volts. A ground plate 26 is located below power plate 24, and sheet 28 is sandwiched between the power and ground plate. Sheet 28 includes a plurality of enclosed signal leads 30 running to terminals 32 about the periphery of the sheet. Power plate 24 has a plurality of apertures 34 which are aligned with and correspond to the apertures 22 in connector plate 20, except for those apertures corresponding to power contacts on chip 18. Each contact on the exposed, front face of chip 18 is electrically connected to power plate 24, ground plate 26 or a signal lead 30 as shown in subsequent drawings.

Referring to FIG. 3, semiconductor chip 18 is attached to the underside of cold plate 16 by a layer of thermally conductive adhesive or solder 40. The exposed face 42 of chip 18 has a two dimensional array of contacts including power contacts such as power contact 44, ground contacts such as ground contact 46, and signal contacts such as signal contacts 48.

Each aperture 22 in connector plate 20 is filled with an elastomeric material 50, preferably silicone rubber (see FIG. 4A). A hole 52 is drilled in elastomeric material 50 to provide a subaperture, and copper 54 or other conductive material is plated in the drilled hole to form a conductor. Because plated conductor 54 is completely surrounded and supported by elastomeric material 50, the conductor is flexible and free to move laterally within limits. A solder connection 56 is provided between each power contact 44, ground contact 46 and signal contact 48 and the associated plated conductor 54 (see FIG. 4) so that the conductor is electrically coupled to its associated contact.

Power plate 24 is constructed of a rigid electrically conductive material, typically metal such as copper. As is evident from FIG. 3, apertures 34 are aligned with and correspond to the apertures 22 in connector plate 20, except that no aperture is located in power plate 24 corresponding to the location of a power contact 44. Power plate 24, including the inside of apertures 34, is fully coated with an electrically insulative material 60. A small aperture 62 is formed in the insulation at a position corresponding to each power contact 44, and a short electrically conductive power post 64 is located in aperture 62. A solder connection 66 is made between each plated conductor 54 connected to a power contact 44 and each power post 64 so that each power contact 44 is electrically coupled to power plate 24 (see FIG. 5).

Medium length electrically conductive signal posts 67 are located in the apertures 34 in power plate 24 corresponding to signal contacts 48 on semiconductor chip 18. Signal posts 67 extend completely through the insulated aperture in the power plate. Sheet 28, which includes a sandwich of thin film layers 28', 28" encapsulating leads 30, is spaced from power plate 24 and ground plate 26 by insulated spacers 68. As illustrated in FIG. 6, signal posts 67 penetrate the upper layer 28' of sheet 28, and engage enlarged portions 30' of the respective signal leads 30. A solder connection 70 is made between each signal post 67 and a plated conductor 54 joined to a signal contact 48 to provide an electrical connection between the signal contacts and the respective leads 30. One lead 30 is provided for each signal contact 48 and extends to a terminal 32 along an edge of sheet 28.

A long ground post 72 is joined by a solder connection 74 to each plated conductor 54 connected to a ground contact 46 on semiconductor chip 18 (see FIG. 7). Each ground post 72 extends through an insulated apertures 34 in power plate 24, through sheet 28, and into an aperture 76 in ground plate 26, where it makes intimate contact with the ground plate. Each ground post 72 is constructed of an electrically conductive material, and provides an electrical connection between the respective ground contacts 46 on semiconductor chip 18 and ground 26.

An alternate embodiment 80 of the conductor plate of the present invention is illustrated by reference to FIGS. 8 and 9. In this alternate embodiment, the configuration of semiconductor chip 18, and its two dimensional array of power contacts 44, ground contacts 46, and signal contacts 48, is identical to that of that illustrated with reference to the first embodiment of the conductor plate, and the elements are given identical reference numerals. Similarly, the configuration of power plate 24 and its associated power posts 64, ground plate 24 with ground posts 72, and lead sheet 28 with lead posts 67, is identical to the first embodiment and the elements are also given identical reference numerals.

Connector plate 80 is made of a rigid, electrically insulative material such as plastic or ceramic. A plurality of apertures 82 are formed in connector plate 80, the apertures being aligned with and corresponding to the respective power, ground and signal contacts 44, 46 and 48 on the exposed front surface 42 of semiconductor chip 18. An S-shaped copper wire 84 is located in each aperture 82. Solder connections 86 are made between each wire 84 and an associated power, ground or signal contact 44, 46 or 48. Similarly, at the other end each S-shaped wire 84, a solder connection 88 is made to each power post 64, signal post 67 and ground post 72. Thus, each contact on chip 18 is flexibly and electrically coupled to its associated post, which is in turn electrically coupled to either power plate 24, ground plate 26 or one of the signal leads 30.

Referring now to FIGS. 10-13, a low power embodiment 90 of a module incorporating the present invention is described. As illustrated in FIG. 10, module 90 comprises a CMOS (low power) semiconductor chip 94 mounted on a printed circuit board 96 by means of an intermediate connector plate 80. Connector plate 80 is identical to that used in the module of FIGS. 8 and 9, and is given the same reference numerals. The connector plate 20 of the embodiment of FIG. 1 could alternatively be used in this application. The chip 94 includes a plurality of contacts 100 formed on one face thereof. Usually the contacts 100 will provide the necessary power and ground connection(s) to the integrated circuit as well as the signal connections. The power and ground connections, however, may be made separately if desired for a particular application.

Printed circuit board 96 is a multiple-layer printed circuit board which provides for both external connection of the chip 94 and interconnection between different chips 94 which may be mounted on the same board or an adjacent board. As best observed in FIG. 3, board 96 includes a plurality of horizontal leads or traces 102 and vertical leads or traces 104. Particular vertical leads 106 terminate at their upper ends (as viewed in FIG. 12) in contacts 108 which are formed on the upper surface of board 96. In this way, interconnections are provided between contacts 108 and peripheral signal terminals 110 formed along the edge of the board 96. It will be appreciated that the traces 102 and 104 will also provide for interconnection between different integrated circuits mounted on a common board 96. The traces 102 and 104 may also provide for interconnection between contacts 100 on the same chip 94. A wide variety of different types of circuit board and other types of connections can be employed within the scope of the present invention.

The connector plate 80 is best illustrated in FIG. 13. Plate 80 is a flat sheet of electrically non-conductive material having a plurality of apertures 82 formed therein. The apertures 82 are arranged in a pattern corresponding to the array of contacts 100 on the chip 94. The contacts 108 on board 96 are arranged in substantially the same pattern. Each aperture 82 includes a resilient S-shaped copper wire 84 soldered to contacts 100 and 108. The resilient nature of the wires 84 allows the electrical connection to be maintained even as the contacts 100 and 108 move relative to one another during fabrication and operation.

To complete the module 90, a heat sink plate 86 is mounted on top of the integrated circuit 94. The upper face of chip 94 is laminated to the lower surface of the heat sink 116 by means of a thin polymer layer 118, typically a silver-loaded epoxy layer having a thickness of about 1.5 mils which has excellent thermal conductivity. The lamination is carried out under vacuum and heat, typically 150° C. for from 1 to 4 hours. The upper surface of the heat sink 46 includes a plurality of cooling fins 120 to allow convective cooling of the heat sink surface. The heat sink will be fabricated from a thermally conductive metal, typically molybdenum, which has thermal expansion characteristics similar to silicon.

The heat sink 116 is secured to the printed circuit board 96 by means of a sealing member 122 which includes an upper opening 124 for receiving chip 94 and a lower opening 126 for receiving the connector plate 80. The sealing member 122 is laminated on its upper surface to the bottom of the heat sink 116 and along its lower surface to board 96. The sealing member 122 may be fabricated from a polymeric or ceramic material, preferably ceramic if it is desired to hermetically seal chip 94.

It will be appreciated that both embodiments 20, 80 of the connector plate provide a flexible coupling between the chip contacts and the appropriate plate or signal lead. The flexible connections provided by the connector plate allow for a substantial amount of relative movement between each chip contact and the plate or lead to which the contact is electrically coupled. In this fashion, any thermal expansion mismatch can be accommodated with no appreciable mechanical strain exerted on the chip or the connections. Thus, during the heat of assembly, for example when the soldering connections are made, and in use, the chance that thermal expansion mismatch will result in broken connections or fractures in the chip circuits is minimized.

While preferred embodiments of the present invention have been illustrated in detail, it is apparent that modifications and adaptations of that embodiment will occur to those skilled in the art. However, it is to be expressly understood that such modifications and adaptations are within the spirit and scope of the present invention, as set forth in the following claims.

What is claimed is:

1. A semiconductor chip module comprising:
   a semiconductor chip having an exposed front face with a two-dimensional array of contacts thereon;
   a connector plate immediately proximate the front face of the chip having a plurality of apertures corresponding to and aligned with the contacts on the semiconductor chip;
   a plurality of transmission means located proximate the connector plate opposite from the semiconductor chip; and
   a plurality of flexible conductor means extending through respective apertures of the connector plate, wherein individual conductor means are soldered at one end to a contact on the chip and at the other end to the transmission means.

2. The module of claim 1 wherein the connector plate is constructed of rigid material, and wherein each conductor means comprises deformable material located in the associated aperture in the connector plate, and a conductor extending through the deformable material.

3. The module of claim 2 wherein the deformable material has a drilled hole, and wherein the conductor comprises conductive material plated in the drilled hole.

4. The module of claim 2 wherein the deformable material is silicone rubber.

5. The module of claim 1 wherein the each conductor means comprises an elongate, electrically conductive element having a curved portion intermediate its ends to provide flexibility.

6. The module of claim 5 wherein each conductive element has an S-shape intermediate its ends.

7. A semiconductor chip module comprising:
   a semiconductor chip having an exposed front face with a two dimensional array of contacts thereon;
   a rigid connector plate proximate the front face of the chip having a plurality of apertures corresponding to and aligned with the contacts of the semiconductor chip, the aperatures being filled with a deformable material having a central subaperture with a conductive material plated in the subaperture; and transmission means located proximate the connector plate on the side opposite from the semiconductor chip;

wherein said conductive material is fixed at one end to a contact on the chip and is fixed at the other end to said transmission means.

8. The module of claim 7 wherein the deformable material is silicone rubber.

9. The module of claim 7 wherein the plated material is plated copper.

10. A semiconductor chip module comprising:

a semiconductor chip having an exposed front face with a two dimensional array of contacts thereon;

a rigid connector plate proximate the front face of the chip having a plurality of apertures corresponding to and aligned with the contacts on the semiconductor chip;

transmission means located proximate the connector plate opposite from the semiconductor chip; and a plurality of S-shaped wires extending through respective apertures of the connector plate, wherein one end of each wire is soldered to a contact on the chip and the other end of the wire is soldered to the transmission means.

11. The module of claim 10 wherein the wires are constructed of copper.

12. The module of claim 1 wherein the dimensional array of contacts on the semiconductor chip includes signal contacts, and wherein the conductor means includes signal conductor means.

13. The module of claim 1, 7 or 10 wherein the two dimensional array of contacts on the semiconductor chip includes power and ground contacts, and the transmission means includes power and ground transmission means.

14. The module of claim 1, 7, or 10 and additionally comprising a heat sink with a flat surface, the semiconductor chip having a back face attached flush to the flat surface of the heat sink.

15. The module of claim 14 wherein the heat sink is water cooled.

16. The module of claim 14 wherein the heat sink is air cooled.

17. The module of claim 1, 7 or 10 wherein the semiconductor chip has an area of approximately 3,600 square millimeters.

18. The module of claim 1, wherein the connector plate is constructed of a resilient material and the flexible conductor means are metal wires.

19. The module of claims 1, 7 or 10, wherein the transmission means comprises a printed circuit board.

20. The module of claims 1, 7 or 10, wherein the transmission means comprises a power plate, a ground plate, and a signal lead sheet.

* * * * *